United States Patent
Ahearne et al.

(10) Patent No.: US 11,456,565 B2
(45) Date of Patent: Sep. 27, 2022

(54) CONNECTOR WITH INTEGRATED RESETTABLE THERMAL FUSE

(71) Applicant: BOURNS, INC., Riverside, CA (US)

(72) Inventors: Brian Ahearne, Cork (IE); Stelar Chu, Tao-Yuan (TW)

(73) Assignee: Bourns, Inc., Riverside, CA (US)

( * ) Notice: Subject to any disclaimer, the term of this patent is extended or adjusted under 35 U.S.C. 154(b) by 709 days.

(21) Appl. No.: 16/322,736

(22) PCT Filed: Jul. 31, 2017

(86) PCT No.: PCT/US2017/044607
§ 371 (c)(1),
(2) Date: Feb. 1, 2019

(87) PCT Pub. No.: WO2018/026689
PCT Pub. Date: Feb. 8, 2018

(65) Prior Publication Data
US 2021/0384683 A1    Dec. 9, 2021

Related U.S. Application Data

(60) Provisional application No. 62/369,956, filed on Aug. 2, 2016.

(51) Int. Cl.
*H05K 1/02* (2006.01)
*H01C 1/14* (2006.01)
*H01R 13/696* (2011.01)

(52) U.S. Cl.
CPC ......... *H01R 13/696* (2013.01); *H01C 1/1406* (2013.01); *H05K 2201/10181* (2013.01)

(58) Field of Classification Search
CPC .. H01R 13/696; H01C 1/1406; H05K 1/0293; H05K 2201/10181
(Continued)

(56) References Cited
U.S. PATENT DOCUMENTS 5,691,688 A    11/1997 West et al.
5,712,610 A *  1/1998 Takeichi .............. H01H 85/046
                                                              29/623

(Continued)

FOREIGN PATENT DOCUMENTS

CN    1299580 A    6/2001
CN    1714413 A    12/2005
(Continued)

OTHER PUBLICATIONS

International Search Report and Written Opinion in International Application No. PCT/US2017/044607, dated Nov. 29, 2017, 16 pages.
(Continued)

*Primary Examiner* — Anatoly Vortman
(74) *Attorney, Agent, or Firm* — Knobbe Martens Olson & Bear LLP

(57) ABSTRACT

A connector for providing electronic communication with an electronic device is disclosed. The connector can comprise a substrate comprising layers of non-conductive material and conductive material. The connector can include an interface member mounted to the substrate and electrically connected with the conductor. A positive temperature coefficient (PTC) fuse can be embedded in the substrate and electrically connected with the conductor and the interface member. At least a portion of the PTC fuse can be disposed directly below the interface member.

27 Claims, 5 Drawing Sheets

(58) Field of Classification Search
USPC .................................................. 337/297
See application file for complete search history.

(56) References Cited

U.S. PATENT DOCUMENTS

| | | | | |
|---|---|---|---|---|
| 5,884,391 | A * | 3/1999 | McGuire | H01C 1/1406 29/612 |
| 6,239,977 | B1 * | 5/2001 | Price | H01C 1/1406 337/297 |
| 6,487,084 | B1 | 11/2002 | Chu et al. | |
| 7,335,855 | B2 | 2/2008 | von der Lühe et al. | |
| 9,693,446 | B2 | 6/2017 | Ragg | |
| 9,960,545 | B2 | 5/2018 | Golubovic et al. | |
| 2006/0055500 | A1 | 3/2006 | Burke et al. | |
| 2006/0055501 | A1 * | 3/2006 | Burke | H01C 1/148 338/22 R |
| 2006/0152329 | A1 * | 7/2006 | Bjorsell | H01C 1/148 338/22 R |
| 2008/0100979 | A1 | 5/2008 | Wang et al. | |
| 2009/0027821 | A1 * | 1/2009 | Colby | H01H 85/0418 361/104 |
| 2011/0003179 | A1 * | 1/2011 | Jang | H01M 50/591 429/7 |
| 2011/0135968 | A1 * | 6/2011 | Kim | H01M 50/209 429/7 |
| 2012/0094509 | A1 | 4/2012 | Bryan et al. | |
| 2013/0015929 | A1 | 1/2013 | Bryan et al. | |
| 2013/0176655 | A1 | 7/2013 | Tseng et al. | |
| 2014/0209365 | A1 | 7/2014 | Tsai et al. | |
| 2015/0171568 | A1 * | 6/2015 | Kawamoto | H01R 13/7137 439/620.08 |
| 2015/0288110 | A1 * | 10/2015 | Taniguchi | H01R 13/6683 439/620.22 |
| 2015/0364874 | A1 * | 12/2015 | Lim | H01R 13/7137 439/620.22 |
| 2016/0197500 | A1 * | 7/2016 | Liang | H02H 3/085 320/114 |
| 2017/0125954 | A1 * | 5/2017 | Tseng | H01R 13/6616 |
| 2017/0201050 | A1 * | 7/2017 | Akita | H01R 13/6683 |
| 2018/0262000 | A1 * | 9/2018 | Golubovic | H02H 5/047 |

FOREIGN PATENT DOCUMENTS

| | | | | |
|---|---|---|---|---|
| CN | 101944584 | A | | 1/2011 |
| CN | 202475937 | | | 10/2012 |
| CN | 202475937 | U | * | 10/2012 |
| CN | 202 697 037 | U | | 1/2013 |
| CN | 203491732 | U | * | 3/2014 .......... H02J 7/00308 |
| CN | 204289919 | U | * | 4/2015 |
| CN | 205960251 | U | * | 2/2017 |
| CN | 109643595 | A | | 4/2019 |
| EP | 2 372 827 | A1 | | 10/2011 |
| EP | 3494581 | A1 | | 6/2019 |
| JP | 2002-280746 | A | | 9/2002 |
| JP | 2019-525416 | | | 9/2019 |
| WO | WO 2004/053898 | | | 6/2004 |
| WO | WO 2015/190020 | | | 12/2015 |
| WO | WO 2018/026689 | A1 | | 2/2018 |

OTHER PUBLICATIONS

Written Opinion in International Application No. PCT/US03/02339, dated Feb. 1, 2005, 6 pages.
The First Office Action of Chinese Patent Application No. 201780048983.8—21 pages (dated Jul. 16, 2020).
The Second Office Action of Chinese Patent Application No. 201780048983.8—21 pages (dated Mar. 23, 2021).
Office Action of Japanese Patent Application No. 2019-505495—10 pages (dated Aug. 24, 2021).
Extended European Search Report dated Jun. 8, 2020, in European Application No. 17837461.7, 8 pages.

* cited by examiner

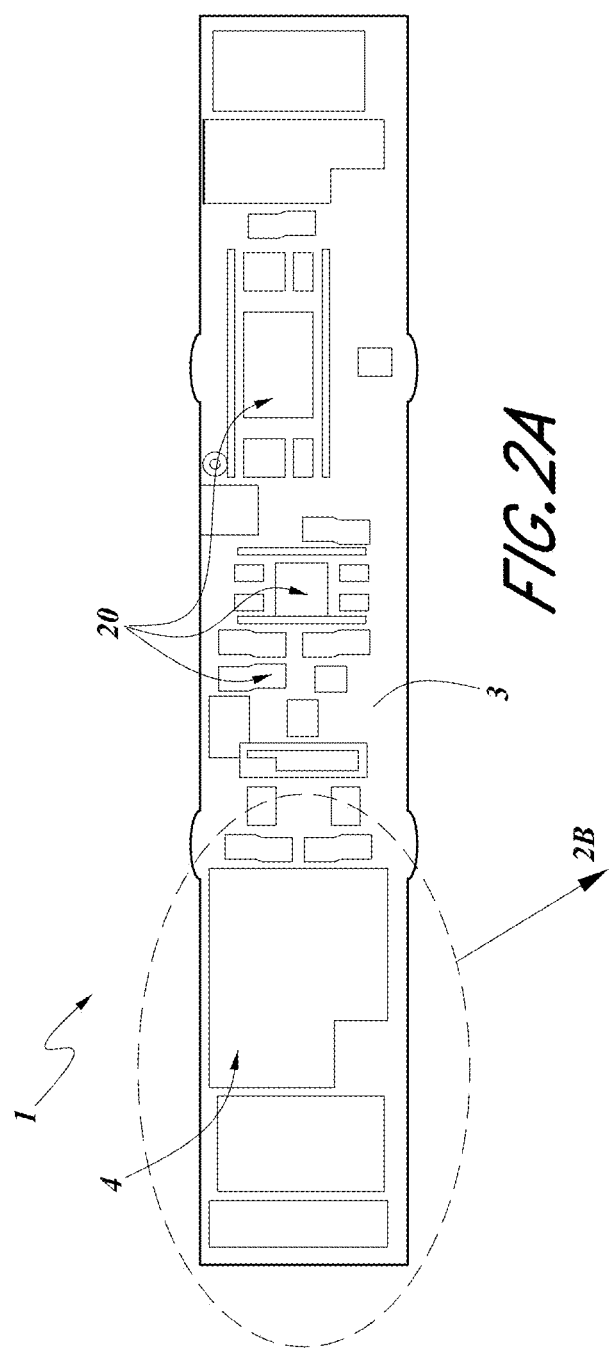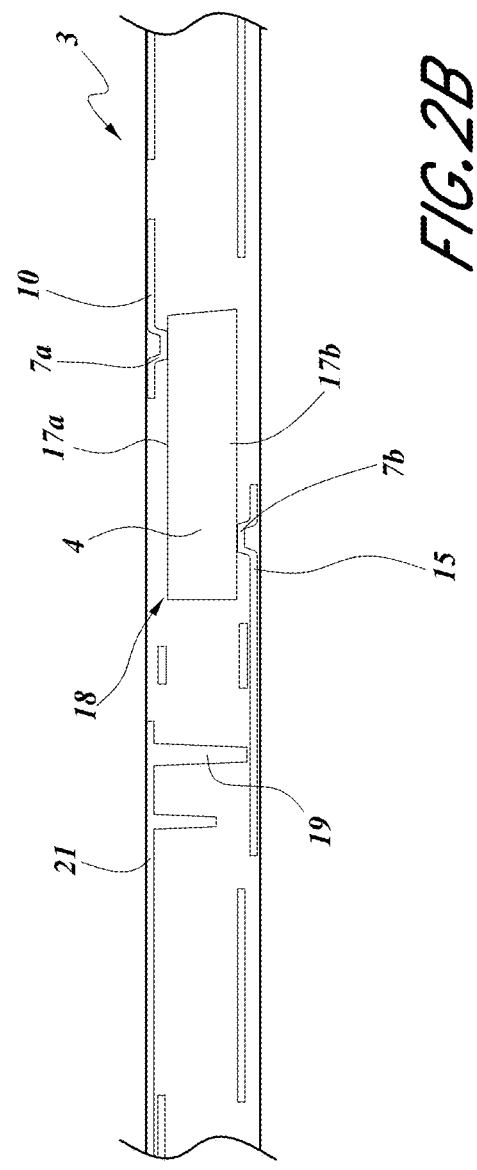

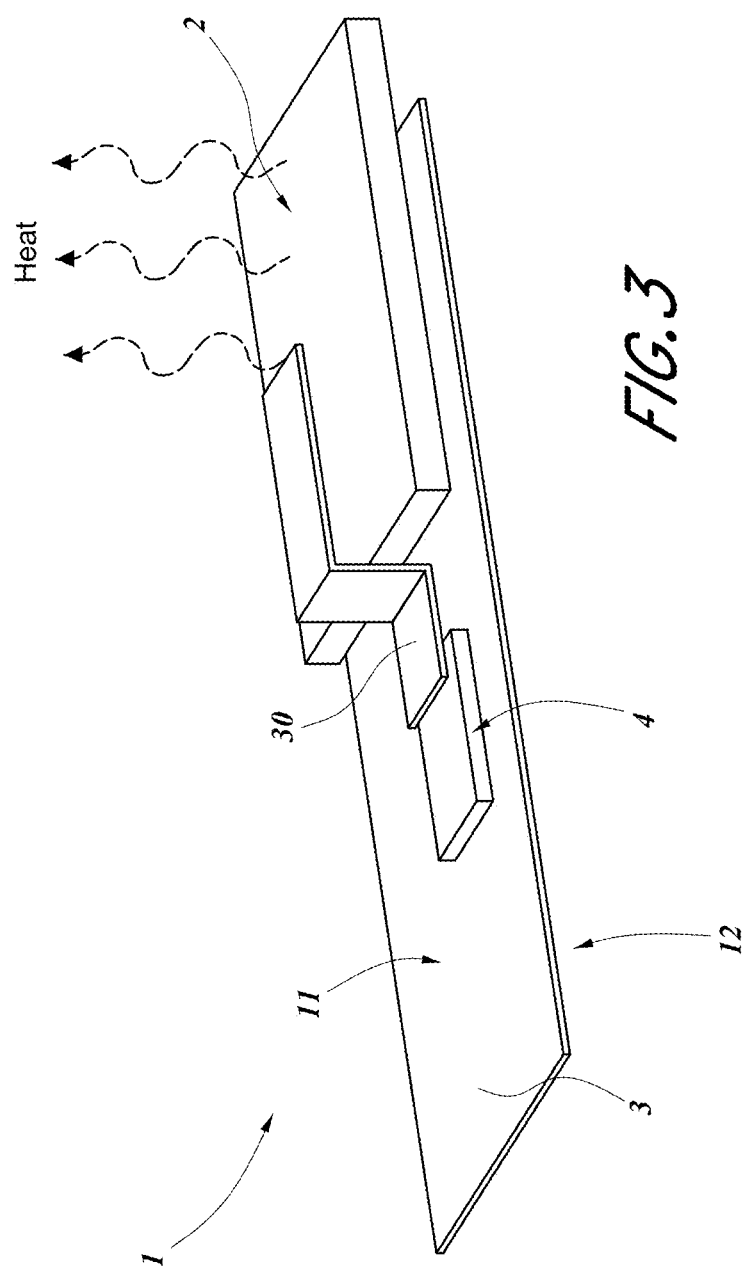

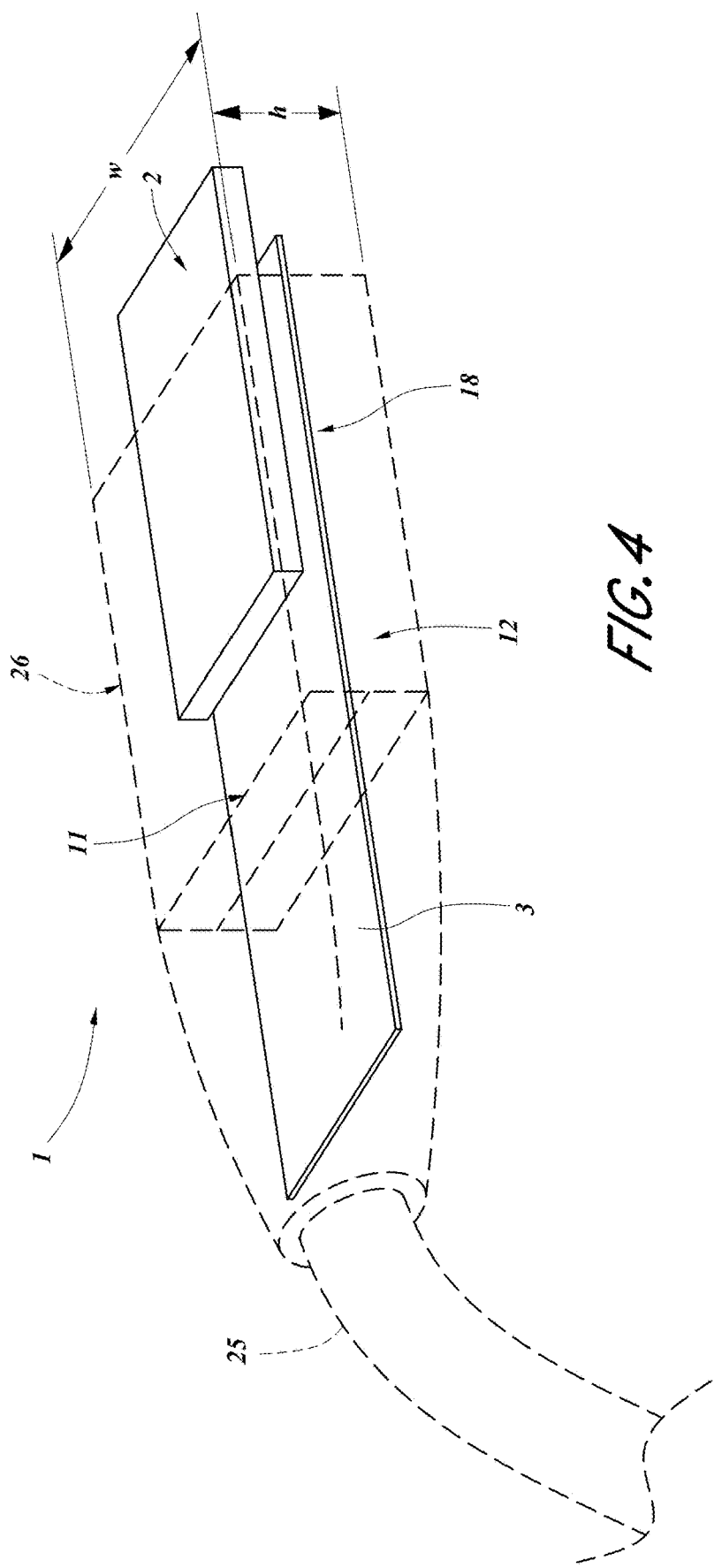

CONNECTOR WITH INTEGRATED RESETTABLE THERMAL FUSE

BACKGROUND

Field

The field relates to a connector with an integrated resettable thermal fuse, and in particular to a connector with an integrated positive temperature coefficient (PTC) fuse.

Description of the Related Art

Various types of electronic devices can include one or more ports that enable the electronic device to be connected to assorted peripheral devices. An electronic device or a computing device (such as a laptop computer, a desktop computer, a smartphone, a tablet computing device, etc.) can include a port that connects to a cable associated with a desired peripheral device. For example, the peripheral device may comprise another computing device, an external mouse or keyboard, a memory device (such as a portable memory stick), power supply electronics (such as a transformer for a power cord), and/or any other suitable types of peripheral devices.

When the cable is inserted into the port, data can be exchanged between the peripheral device and the electronic device along one or more data lines of the cable, and/or electrical power can be transferred between the peripheral device and the electronic device along one or more power lines of the cable. In some arrangements, the transfer of electrical energy along the cable can result in overheating and/or excessive current within the electronic device and/or the peripheral device. Such overheating and/or overcurrent conditions may damage the electronic device and/or the peripheral device. Accordingly, there remains a continuing need to reduce or eliminate damage caused by excessive temperature and/or current in the cable.

SUMMARY

In one embodiment, a connector for providing electronic communication with an electronic device is disclosed. The connector can include a substrate comprising patterned layers of non-conductive material and conductive material. The connector can include an interface member mounted on the substrate and electrically connected with the conductive material. A positive temperature coefficient (PTC) fuse can be embedded in the substrate and electrically connected with the conductive material and the interface member. At least a portion of the PTC fuse can be disposed directly below the interface member.

In one embodiment, a In one embodiment, a connector for providing electronic communication with an electronic device is disclosed. The connector can include a substrate comprising patterned layers of non-conductive material and conductive material. The connector can include an interface member mounted on the substrate and electrically connected with the conductive material. The connector can include a resettable thermal fuse embedded in the substrate and electrically connected with the conductive material and the interface member. At least a portion of the resettable thermal fuse can be disposed directly below the interface member.

In another embodiment, a connector for providing electronic communication with an electronic device is disclosed. The connector can comprise a substrate comprising patterned layers of non-conductive material and conductive material. The connector can include an interface member mounted on an upper surface of the substrate and electrically connected with the conductive material. The connector can comprise a resettable thermal fuse mounted to the upper surface of the substrate and electrically connected with the conductive material and the interface member, the resettable thermal fuse laterally offset in close proximity to the interface member. The connector can include a conductive tab providing electrical communication between the interface member and the resettable thermal fuse, the conductive tab disposed over an upper surface of the substrate.

In another embodiment, a method for manufacturing a connector is disclosed. The method can include providing a substrate comprising patterned layers of non-conductive material and conductive material and a resettable thermal fuse embedded in the substrate and electrically connected with the conductive material. The method can include mounting an interface member on the substrate. The method can include electrically connecting the interface member with the conductive material and the resettable thermal fuse. At least a portion of the resettable thermal fuse can be disposed directly below the interface member.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

Specific implementations of the invention will now be described with reference to the following drawings, which are provided by way of example, and not limitation.

FIG. 2A is a schematic top plan view of a substrate, according to various embodiments.

FIG. 2B is a schematic side cross-section of the substrate shown in FIG. 2A.

FIG. 3 is a schematic perspective view of a connector, according to another embodiment.

FIG. 4 is a schematic perspective view of a connector coupled with a cable, according to various embodiments.

DETAILED DESCRIPTION

Figure 1A:
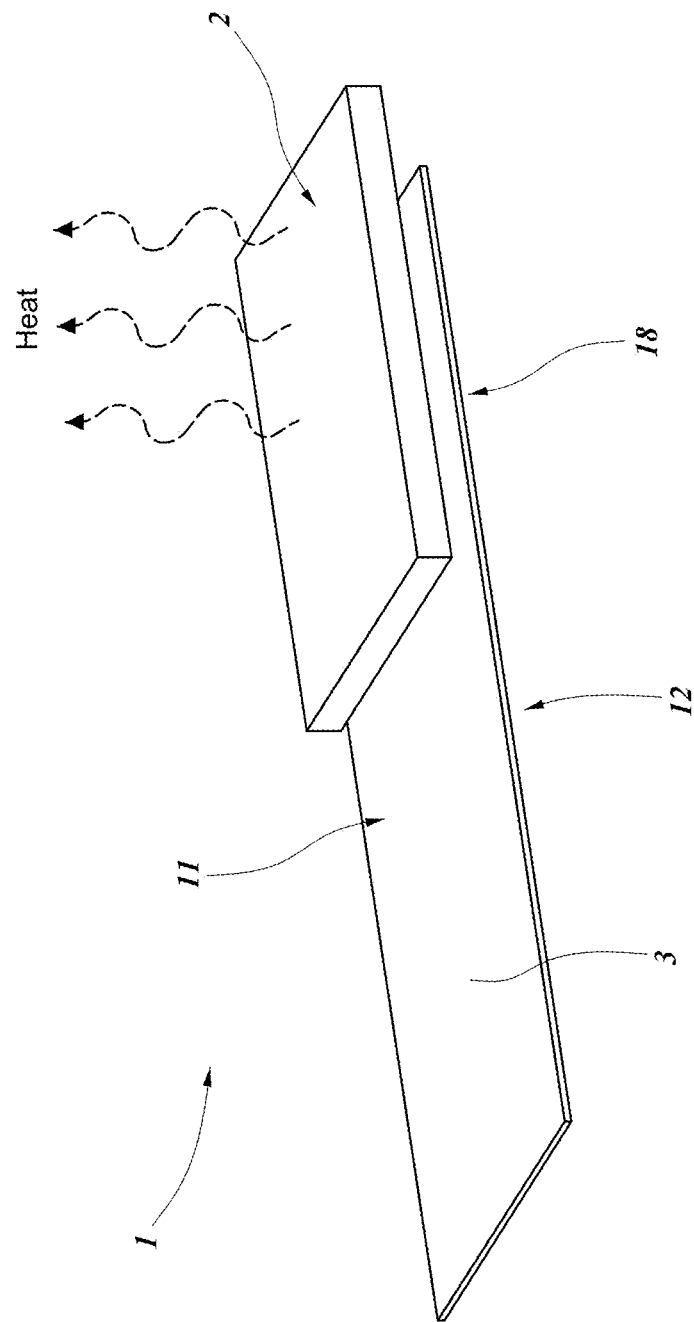
FIG. 1A is a schematic perspective view of a connector, according to various embodiments.

Various embodiments disclosed herein relate to a connector with an integrated thermally resettable fuse, e.g., a positive temperature coefficient (PTC) element or fuse. For example, as explained above, various types of electronic devices can exchange data with a peripheral device along one or more data lines and can transfer power with the peripheral device along one or more power lines. In such devices, it can be important to ensure that the connector does not experience excessive temperatures and/or currents in order to reduce the risk of damage to the larger electronic device and/or to the peripheral device. Note that references to larger devices and peripheral devices herein are merely examples and not intended to be limiting. The skilled artisan will appreciate that connectors as described herein can be employed in numerous different applications, including data/power cables, such as USB cables, which can connect any of a number of different types of devices. It will also be understood that, while described as serving to connect first and second electronic devices in operation, that the connector described herein can exist in a cable, such as a USB cable, which may be unconnected to any electronic devices.

In some embodiments, for example, the connector can include a substrate comprising a non-conductive material and a conductor formed with the non-conductive material. For example, in some embodiments, the substrate can comprise a printed circuit board (PCB) in which layers of nonconductive material (e.g., FR4 or FR5, also known as "prepreg") and conductive material (e.g., metal, such as copper) are laminated together. The connector can also include an interface member mounted to the substrate and electrically connected with the conductor. The interface member can comprise various input-output (I/O) terminals that provide data communication to and/or from the electronic device (e.g., by way of one or more data lines), and/or that provide power to and/or draw power from the electronic device (e.g., by way of one or more power lines). The connector can also include a positive temperature coefficient (PTC) element embedded in the substrate and electrically connected with the conductor and the interface member. At least a portion of the PTC element can be disposed directly below the interface member.

The connector disclosed herein can be used with cables and devices that utilize the Universal Serial Bus (USB) standard. For example, the connector disclosed herein can be incorporated into a cable having one or more data lines and/or one or more power lines. The embodiments disclosed herein can be used with any suitable version of the USB standard. As an example, the disclosed embodiments can be used in connection with USB 2.0, in which four I/O terminals (two for power and two for data) are used. The disclosed embodiments may also be used in USB 3.1 in which 10 I/O terminals (8 for data and 2 for power) are provided. In some arrangements, the disclosed embodiments can be used in connection with USB 3.0 as well. Indeed, the connector disclosed herein can be utilized with any suitable version of USB, and indeed with cables and devices conforming to other standards. The connector can be removably inserted into an electronic device to transfer data to and/or from the electronic device over the data line(s), and to supply power to and/or draw power from the electronic device over the power line(s). In other embodiments, the connector may be incorporated into a device other than a cable, such as a memory stick, a computing device, etc. Thus, in some embodiments, the connector may be integrated with a cable, and in other embodiments, the connector may be integrated with a particular electronic device. In various embodiments, the connector may comprise a male connector. In other embodiments, the connector may comprise a female connector.

In various arrangements, the connector may experience elevated temperature and/or excessive current. For example, surges in current along the power line(s) may damage the electronic device and/or the peripheral device that is connected to the electronic device. One way to mitigate or prevent damage to the electronic device and/or the peripheral device is to incorporate a positive temperature coefficient (PTC) element, which serves as a resettable fuse, into the connector. The fuse can incorporate a PTC material, in which the resistivity of a normally conductive material increases as the temperature of the material increases. Examples of such a material used in PTC elements are organic polymers, made electrically conductive by dispersing conductive fillers therein. These polymers may include polyolefins such as polyethylene, polypropylene and ethylene/propylene copolymers. Conductive fillers can include carbon black and metal powders. In some arrangements, a PTC fuse comprises a layer of conductive polymer PTC material sandwiched between conductive layers, e.g., between upper and lower metal foil electrodes.

At temperatures below a predetermined value, a PTC element may exhibit a relatively low resistivity (which may be relatively constant). However, as the temperature of the PTC element increases beyond the predetermined temperature, the resistivity of the material of the PTC element sharply increases with temperature. In various embodiments, for example, the resistivity may increase to such an extent so as to significantly impede current from passing through the PTC element. When the temperature of the material in the PTC element cools down below the predetermined temperature, the resistivity reverts to its lower value such that electrical current can pass through without significant losses. Due to the hysteresis properties of the PTC element, therefore, the PTC element can be used in a first, normal operating state in which current passes through the PTC element with little resistance. If the temperature of the PTC element rises above the predetermined temperature so as to indicate an overtemperature or overcurrent condition, then the PTC element switches to a second, fault state in which little to no current passes through the PTC element to protect the connected device(s). Once the temperatures drop to desired levels, the PTC element can revert to the normal operating state. In various embodiments, the predetermined temperature at which the PTC element switches from the first state to the second state is in a range of 65° C. to 170° C. In some embodiments, the predetermined temperature at which the PTC element switches from the first state to the second state is in a range of 65° C. to 90° C., in a range of 65° C. to 80° C., or in a range of 68° C. to 72° C. In some embodiments, the predetermined temperature at which the PTC element switches from the first state to the second state is in a range of 100° C. to 170° C., in a range of 110° C. to 150° C., or in a range of 115° C. to 125° C. In various arrangements, temperature and/or current can be used to define when the PTC element switches from the first state to the second state. For example, the PTC element can switch from the first state to the second state at a current in a range of 1 A to 5 A, in a range of 2 A to 4 A, or in a range of 2.5 A to 3.5 A. Additional details of PTC elements or materials that can be used in conjunction with any of the disclosed embodiments may be found throughout U.S. Patent Publication No. US 2006/0055501, the disclosure of which is incorporated by reference herein in its entirety and for all purposes.

Figure 1B:
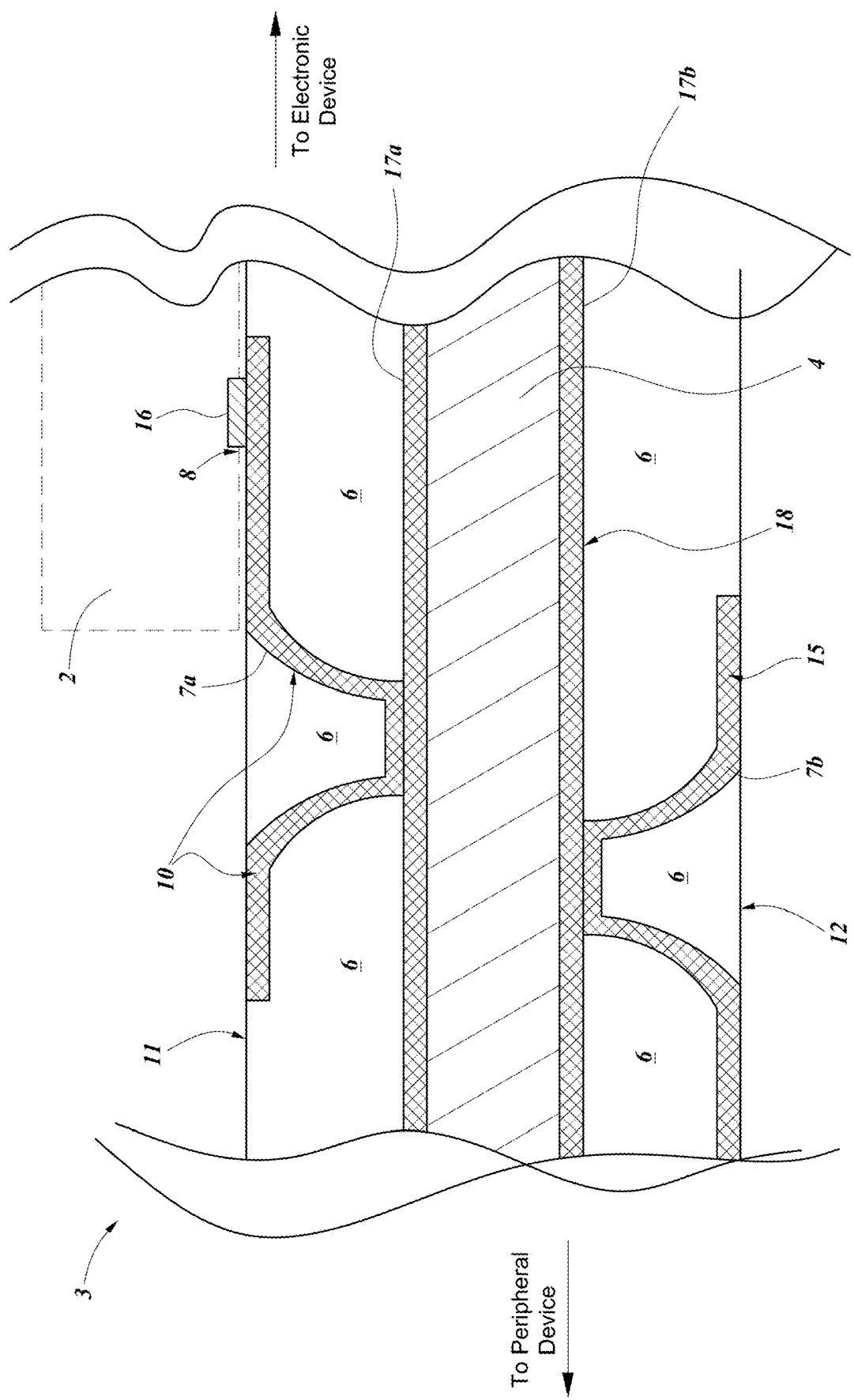
FIG. 1B is a schematic side cross-sectional view of a portion of the connector shown in FIG. 1A.

FIG. 1A is a schematic perspective view of a connector 1, according to various embodiments. FIG. 1B is a schematic side cross-sectional view of a portion of the connector 1. The connector 1 can be configured to provide electronic communication (including, e.g., data communication and/or electrical power) between a first electronic device and a second electronic device. As explained above, the first electronic device can comprise a computing device (such as a laptop computer, a desktop computer, a smartphone, a tablet computing device, etc.), an imaging system, an audio system, etc. The second electronic device can comprise another device, e.g., peripheral, electronic or computing device, an external mouse or keyboard, a memory device (such as a portable memory stick), power supply electronics (for a power cord), an imaging system, an audio system, and/or any other suitable types of peripheral devices. In some embodiments, the connector 1 can conform to the USB standards as set forth at usb.org, such as USB 2.0 or USB 3.1.

The connector 1 can comprise a substrate 3 and an interface member 2 mounted to an upper surface 11 of the substrate 3. The interface member 2, which is illustrated schematically as a simple block, can comprise various I/O terminals that provide data communication to and/or from the electronic device (e.g., by way of one or more data lines), and/or that provide power to and/or draw power from the electronic device (e.g., by way of one or more power lines). In various embodiments, the interface member 2 can be removeably inserted into (or can receive) a corresponding portion of the electronic device so as to provide mechanical connection and electronic communication between the first and second electronic devices. Thus, the interface member 2 may comprise suitable mechanical connections or latches to mechanically connect to the electronic device, as well as I/O terminals for data and/or electrical communication with the electronic device. The connector 1 can be formed at the terminal end of a cable (e.g., a USB cable), or can extend integrally from one of the electronic devices (e.g., from a memory stick). The substrate 3, in turn, can electrically connect the connector 1 with the cable wiring or the electronic device with which the connector is integrated.

As shown in FIG. 1B, the substrate 3 can comprise one or more patterned layers, e.g., a non-conductive material 6 and a conductive material comprising one or more conductors (e.g., first and second conductors 10, 15) formed with and/or embedded in the non-conductive material 6. In some embodiments, the substrate 3 can comprise a laminate substrate, such as a PCB substrate, in which the conductors 10, 15 may be embedded in the non-conductive material 6 (such as FR-4 or FR-5 board). In some embodiments, the substrate 3 may comprise a flexible substrate. In other embodiments, the substrate 3 may comprise any suitable type of material, such as a ceramic non-conductive material formed with the one or more conductors. The first and second conductors 10, 15 can act as metallic traces and/or contact pads to transfer signals between the interface member 2 and the first electronic device (e.g., by way of a cable extending from the interface member 2 to the second electronic device).

As shown in FIGS. 1A and 1B, the connector 1 can comprise a thermally resettable fuse 18. The fuse 18 of FIGS. 1A and 1B can include a PTC material 4 sandwiched between a first metal electrode 17a and a second metal electrode 17b. For example, the PTC material 4 can comprise a polymer material filled with conductive particles (e.g., carbon black) that conducts under normal operating conditions but becomes insulating above a trip threshold temperature. As explained above, the fuse 18 may exhibit hysteresis behavior such that the fuse 18 can become conducting once the temperature falls below a reset threshold. Together the two electrodes 17a, 17b and the PTC material 4 form the fuse 18, which is disposed directly below and horizontally overlapping with the interface member 2. It can be important to position the PTC material 4 as closely as possible to the interface member 2 (which connects to the larger electronic device) such that there is high thermal conductivity between the PTC material 4 of the fuse 18 and the interface member 2. If, on the other hand, the PTC material 4 is positioned at a large distance from the connector 1, then the temperature of the PTC material 4 may be significantly different from the temperature of the connector 1. Thus, as shown in FIGS. 1A-1B, at least a portion of the fuse 18 can be positioned directly below the interface member 2 such that a plane perpendicular to the substrate 3 passes through the interface member 2 and at least a portion of the PTC material 4. In some embodiments, only a portion of the fuse 18 is disposed directly below the interface member 2, and another portion of the fuse 18 is disposed laterally outside the interface member 2. In other embodiments, the entire fuse 18 is disposed directly below the interface member 2. In some embodiments, the fuse 18 can be smaller than, larger than, or about the same size as the substrate 3. For example, in some embodiments, the fuse 18 may be sufficiently sized relative to the substrate 3 so as to provide at least partial lateral overlap between the fuse 18 and the substrate 3.

In some embodiments, the fuse 18 can be completely embedded in the substrate 3 such that the fuse 18 is not exposed at the upper surface 11 of the substrate 3. In such arrangements, for example, the fuse 18 can be sandwiched between different layers of the non-conductive material 6. The fuse 18 can be electrically connected with the first conductor 10 and the interface member 2. For example, the interface member 2 (shown schematically in dashed lines in FIG. 1B) can electrically connect to a contact pad 8 of the first conductor 10 that is exposed on the upper surface 11 of the substrate 3. For example, the interface member 2 can be attached to the contact pad 8 with any suitable conductive interconnect 16, such as solder, conductive epoxy, etc. A first conductive via 7a can pass through the non-conductive material 6 to expose the first electrode 17a of the fuse 18, such that the first conductor 10 provides electrical communication between the interface member 2 and the fuse 18.

Further, as shown in FIG. 1B, a second conductor 15 can be formed with the non-conductive material 6 and a second via 7b can pass through the non-conductive material 6 to expose the second electrode 17b of the fuse 18, such that the second conductor 15 provides electrical communication between the fuse 18 and the second electronic device. As shown in FIG. 1B, the second conductor 15 can be disposed at or near a lower surface 12 of the substrate 3.

In the embodiment of FIGS. 1A-1B, the first and second conductors 10, 15 can form part of a power line that supplies electrical current through the connector 1 between the first electronic device and the second electronic device. For example, in operation, current can flow between the interface member 2 and the second conductor 15 by way of the contact pad 8, the first via 7a, the first electrode 17a of the fuse 18, the PTC material 4 of the fuse 18, the second electrode 17b of the fuse 18 and the second via 7b. The second conductor 15 can convey the current to and/or from the second electronic device. The interface member 2 can convey the current to and/or from the first electronic device to which the connector 1 is to be connected.

If the interface member 2 experiences excessive temperature and/or current, the first conductive via 7a can provide a short thermal pathway by which the PTC element 4 can be heated. Beneficially, positioning at least a portion of the fuse 18 directly below and in close proximity to the interface member 2, the temperature of the PTC material 4 can closely track the temperature of the interface member 2 and significant heat can be transferred even through the non-conductive material 6. For example, in various embodiments, the fuse 18 can be spaced below the interface member 2 by a distance (e.g., defined between an upper surface of the fuse 18 and a lower surface of the interface member 2) such that the difference in temperature between the interface member 2 and the PTC element 4 during operation is in a range of 5° C. to 55° C., or more particularly in a range of 10° C. to 50° C., e.g., in a range of 10° C. to 40° C. In some embodiments, the fuse 18 can be spaced below the interface member 2 by a distance such that the difference in temperature between the interface member 2 and the PTC element 4 during operation is in a range of 5° C. to 20° C., in a range of 5° C. to 15° C., or in a range of 8° C. to 12° C. In some embodiments, the fuse 18 can be spaced below the interface member 2 by a distance such that the difference in temperature between the interface member 2 and the PTC element 4 during operation is in a range of 40° C. to 50° C., or in a range of 43° C. to 50° C. In some embodiments, the PTC element 4 can be spaced below the interface member 2 by a distance less than 5 mm, or more particularly, by a distance less than 3 mm, e.g., by a distance less than 1 mm. For example, the PTC element 4 can be spaced below the interface member 2 by a distance in a range of 0.1 mm to 5 mm, in a range of 0.1 mm to 3 mm, in a range of 0.1 mm to 2 mm, in a range of 0.1 mm to 1 mm, in a range of 0.2 mm to 1 mm, in a range of 0.3 mm to 1 mm, in a range of 0.3 mm to 0.9 mm, in a range of 0.4 mm to 1 mm, or in a range of 0.4 mm to 0.9 mm.

As explained herein, the fuse 18 can have a low resistance state and a high resistance state, such that the fuse 18 is configured to move from the low resistance state to the high resistance state when the temperature of the interface member 2 exceeds a predetermined temperature. The predetermined temperature of the interface member 2 can be in a range of 65° C. to 170° C., in a range of 65° C. to 120° C., in a range of 70° C. to 100° C., in a range of 65° C. to 90° C., in a range of 65° C. to 80° C., or in a range of 68° C. to 72° C. In some embodiments, the predetermined temperature of the interface member 2 can be in a range of 100° C. to 170° C., in a range of 110° C. to 150° C., or in a range of 115° C. to 125° C. The fuse 18 may exhibit asymmetrical hysteresis properties such that the fuse 18 can be configured to move from the high resistance state to the low resistance state when a second predetermined temperature of the interface member 2 is less than 50° C., e.g., less than 40° C. For example, the fuse 18 can be configured to move from the high resistance state to the low resistance state when the predetermined temperature of the interface member 2 is in a range of 20° C. to 50° C., in a range of 25° C. to 40° C., or in a range of 30° C. to 40° C.

In some embodiments, the fuse 18 can have a low resistance state and a high resistance state, such that the fuse 18 is configured to move from the low resistance state to the high resistance state when the temperature of the fuse 18 exceeds a predetermined temperature. The predetermined temperature of the fuse 18 can be in a range of 65° C. to 170° C., in a range of 65° C. to 120° C., in a range of 70° C. to 100° C., in a range of 65° C. to 90° C., in a range of 65° C. to 80° C., or in a range of 68° C. to 72° C. In some embodiments, the predetermined temperature of the interface member 2 can be in a range of 100° C. to 170° C., in a range of 110° C. to 150° C., or in a range of 115° C. to 125° C. The fuse 18 can be configured to move from the high resistance state to the low resistance state when a second predetermined temperature of the fuse 18 is less than 55° C., e.g., less than 50° C. For example, the fuse 18 can be configured to move from the high resistance state to the low resistance state when the predetermined temperature of the fuse 18 is in a range of 25° C. to 55° C., in a range of 30° C. to 50° C., or in a range of 35° C. to 45° C.

As the temperature of the PTC material 4 rises above the predetermined temperature, the resistance of the fuse 18 may accordingly increase so as to significantly impede current from flowing through the PTC material 4. The high resistance of the PTC material 4 in the fault condition or state may act to protect the electronic device and/or the peripheral device. As the overcurrent or overtemperature fault condition subsides, the temperature of the PTC material 4 also subsides. The drop in temperature of the PTC material 4 can accordingly decrease the resistance of the fuse 18, enabling more current to pass through the fuse 18 between the interface member 2 and the second conductor 15.

Although only a single power line is shown (with respect to the conductors 10, 15), in various embodiments, additional power lines may be provided, for example, so as to provide a ground line and a power supply line. Moreover, although not illustrated, one or more data lines may be provided in the substrate 3 to transmit data between the interface member 2 and the peripheral device. For example, in some embodiments, the one or more data lines may be provided at or near the upper surface 11 of the substrate. Thus, in some arrangements, the data line(s) may be provided along or near the upper surface 11, and the power line(s) may extend into the substrate 3, e.g., from the contact pad 8 at or near the upper surface 11 to the second conductor 15 at or near the lower surface 12. Although the second conductor 15 is illustrated as being disposed at or near the lower surface 12, in some embodiments, the second conductor 15 can be embedded within the substrate 3. For example, in some embodiments, one or more insulating layers (such as FR-4 board) can be disposed underneath and above the second conductor 15. In some embodiments, moreover, the current from the second conductor 15 may be routed back to at or near the upper surface 11, e.g., by way of one or more vias 19 and traces 21 (see FIG. 2B).

U.S. Patent Publication No. US 2006/0055501 ("the '501 publication"), which is incorporated herein by reference in its entirety, teaches a method of forming a fuse 18 using PCB technology. The process can be used to form the embedded fuse 18 taught herein by omitting the portions of the process of the '501 publication that singulate fuses to form surface mount devices. Instead, the fuse 18 can remain embedded within the PCB material and the remainder of the substrate 3 can be processed as normal for routing signal and power lines and interconnecting surface mounted devices as shown in FIGS. 2A and 2B, discussed below.

FIG. 2A is a schematic top plan view of a substrate 3, according to various embodiments. FIG. 2B is a schematic side cross-section of the substrate 3 shown in FIG. 2A. The interface member 2 is not shown in FIGS. 2A-2B. Unless otherwise noted, the reference numerals of FIGS. 2A-2B represent components that are the same as or similar to the components shown in FIGS. 1A-1B. FIG. 2A illustrates that one or more additional electrical components 20 (such as integrated device dies, active components, passive components such as capacitors, resistors, etc.) can be provided on the substrate 3 of the connector 1. The electrical components 20 can be configured to control the operation of the connector 1 and how the connector 1 interfaces with the peripheral device and/or the electronic device. For example, various types of integrated device dies (such as controller dies), active components, and/or passive components can be provided on the substrate 3. In some arrangements, various resistors, capacitors, inductors, diodes, and control chips can be provided on the substrate 3 as surface mount devices. Moreover, as shown in FIG. 2B, in some embodiments, one or more vias 19 can route electrical signals from the second conductor 15 back to a trace 21 at or near the upper surface of the substrate 3.

FIG. 3 is a schematic perspective view of a connector 1, according to another embodiment. Unless otherwise noted, the reference numerals of FIG. 3 represent components that are the same as or similar to the components shown in FIGS. 1A-2B. For example, the connector 1 can comprise an interface member 2 mounted to a substrate 3. Unlike the embodiment of FIGS. 1A-2B, however, the fuse 18 can be mounted to the upper surface 11 of the substrate 3 and can be laterally displaced relative to the interface member 2. To enhance thermal conductivity between the interface member 2 and the fuse 18, a conductive tab 30 can be provided to thermally connect the fuse 18 and the interface member 2. As shown in FIG. 3, the conductive tab 30 can be provided over an upper surface of the substrate 3. In some embodiments, the conductive tab 30 may contact an upper surface of the substrate 3. In other embodiments, the conductive tab 30 may not contact the substrate 3 but may instead be vertically offset over the upper surface of the substrate 3. The conductive tab 30 can be wrapped around portions of the fuse 18 and the interface member 2. The conductive tab 30 can comprise any suitable type of conductor, such as nickel. The tab 30 can beneficially provide a direct thermally conductive pathway between the interface member 2 and the PTC element 4 such that the temperature of the fuse 18 closely tracks the temperature of the interface member 2. The fuse 18 can be placed in close proximity to the interface member 2 so as to ensure that the temperature of the fuse 18 is as close as possible to the temperature of the interface member 2. For example, the fuse 18 can be laterally spaced from the interface member 2 by a separation distance in a range of 0.1 mm to 0.8 mm, in a range of 0.1 mm to 0.5 mm, or in a range of 0.1 mm to 0.3 mm, e.g., about 0.2 mm in some embodiments, or about 0.6 mm in some embodiments. Moreover, as shown in FIG. 3, the conductive tab 30 can be bent or shaped to conform to the surfaces of the interface member 2, the substrate 3, and/or the fuse 18. For example, the conductive tab 30 can connect to an upper surface of the interface member 2, can be bent or angled downwardly along a side wall of the interface member 2, and can be further angled laterally outward to connect to the fuse 18.

FIG. 4 is a schematic perspective view of a connector 1 coupled with a cable 25, according to various embodiments. The interface member 2 can be disposed inside an encapsulating material 26. In some embodiments, as shown in FIG. 4, a distal end portion of the interface member 2 can extend distally outside and beyond the encapsulating material 26. For example, the distally-extending portion of the interface member 2 can comprise a male connector to electrically and/or electronically connect to the electronic device.

As explained above, the connector 1 can be sized and configured to conform to any suitable standard, such as the USB standard(s), as explained above. For example, the connector 1 can be dimensioned to comply with the USB standard(s). In various embodiments, a width w of the interface member 2 can be in a range of 5 mm to 15 mm, in a range of 7 mm to 14 mm, in a range of 8 mm to 13 mm. In some embodiments, the width w can be in a range of 6 mm to 7 mm, in a range of 8 mm to 9 mm, or in a range of 11 mm to 13 mm. A height h of the interface member 2 can be in a range of 1 mm to 12 mm, e.g., in a range of 4 mm to 5 mm, in a range of 7 mm to 8 mm, in a range of 10 mm to 11 mm, in a range of 1.5 mm to 3.5 mm, or in a range of 2 mm to 3 mm.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A connector for providing electronic communication with an electronic device, the connector comprising:
   a substrate comprising patterned layers of non-conductive material and conductive material;
   an interface member mounted on the substrate and electrically connected with the conductive material; and
   a resettable thermal fuse embedded in the substrate and electrically connected with the conductive material and the interface member,
   wherein the substrate has an upper surface and a lower surface opposite the upper surface, the interface member mounted on the upper surface of the substrate,
   wherein at least a portion of the resettable thermal fuse is disposed directly below the interface member such that there is a thermally conductive pathway from the interface member to the resettable thermal fuse, the resettable thermal fuse configured to prevent excessive current through a conductive line of the interface member,
   wherein the connector includes one or more terminals configured to provide at least one of power and data communication between the electronic device and another electronic device, and
   wherein the interface member is configured to be removeably connected with the electronic device so as to provide mechanical connection and electrical communication between the electronic device and the another electronic device.

2. The connector of claim 1, wherein the resettable thermal fuse comprises a positive temperature coefficient (PTC) fuse.

3. The connector of claim 1, wherein the resettable thermal fuse is completely embedded within the non-conductive material.

4. The connector of claim 1, wherein a portion of the resettable thermal fuse is disposed directly below the interface member, and another portion of the resettable thermal fuse is disposed laterally outside the interface member.

5. The connector of claim 1, wherein the entire resettable thermal fuse is disposed directly below the interface member.

6. The connector of claim 1, wherein the conductive material comprises a contact pad on the upper surface of the substrate, the interface member being electrically connected to the contact pad.

7. The connector of claim 6, wherein the conductive material comprises a first conductor line and a first via passing through a first layer of the non-conductive material between the contact pad and a first electrode of the resettable thermal fuse to provide electrical communication between the interface member and the resettable thermal fuse.

8. The connector of claim 7, wherein the conductive material further comprises a second conductor line including a second via passing through a second layer of the non-conductive material to provide electrical communication to a second electrode of the resettable thermal fuse.

9. The connector of claim 8, wherein the second conductor line is disposed at or near the lower surface of the substrate.

10. The connector of claim 9, further comprising a third via and a third conductor line at or near the upper surface of the substrate, the third via passing through the non-conductive material to electrically connect to the second conductor line with the third conductor line.

11. The connector of claim 1, wherein the substrate comprises a printed circuit board (PCB).

12. The connector of claim 1, further comprising one or more data lines configured to convey data to and/or from the electronic device.

13. The connector of claim 12, wherein the one or more data lines are disposed at or near the upper surface of the substrate and in communication with the interface member.

14. The connector of claim 1, further comprising one or more power lines configured to convey electrical power to and/or from the electronic device.

15. The connector of claim 14, wherein the one or more power lines are disposed at or near the lower surface of the substrate and in communication with the resettable thermal fuse and the interface member.

16. The connector of claim 1, wherein the resettable thermal fuse has a low resistance state and a high resistance state, wherein the resettable thermal fuse is configured to move from the low resistance state to the high resistance state when the temperature of the interface member exceeds a first predetermined temperature.

17. The connector of claim 16, wherein the first predetermined temperature is in a range of 65° C. to 90° C.

18. The connector of claim 16, wherein the resettable thermal fuse is configured to move from the high resistance state to the low resistance state when a second predetermined temperature is in a range of 20° C. to 50° C.

19. The connector of claim 1, wherein the resettable thermal fuse has a low resistance state and a high resistance state, wherein the resettable thermal fuse is configured to move from the low resistance state to the high resistance state when the temperature of the resettable thermal fuse exceeds a first predetermined temperature.

20. The connector of claim 19, wherein the first predetermined temperature is in a range of 65° C. to 90° C.

21. The connector of claim 19, wherein the resettable thermal fuse is configured to move from the high resistance state to the low resistance state when a second predetermined temperature is in a range of 25° C. to 55° C.

22. The connector of claim 1, further comprising one or more device chips configured to control the operation of the connector.

23. A cable for providing electronic communication between a computing device and a peripheral device, the cable comprising the connector of claim 1, the connector disposed at an end portion of the cable.

24. A method for manufacturing a connector, the method comprising:
providing a substrate comprising patterned layers of non-conductive material and conductive material and a resettable thermal fuse embedded in the substrate and electrically connected with the conductive material, the substrate having an upper surface and a lower surface opposite the upper surface;
mounting an interface member on the upper surface of the substrate; and
electrically connecting the interface member with the conductive material and the resettable thermal fuse,
wherein at least a portion of the resettable thermal fuse is disposed directly below the interface member such that there is a thermally conductive pathway from the interface member to the resettable thermal fuse, the resettable thermal fuse configured to prevent excessive current through a conductive line of the interface member,
wherein the connector includes one or more terminals configured to provide at least one of power and data communication between the electronic device and another electronic device, and
wherein the interface member is configured to be removeably connected with the electronic device so as to provide mechanical connection and electrical communication between the electronic device and the another electronic device.

25. The method of claim 24, wherein the resettable thermal fuse is completely embedded within the non-conductive material.

26. The method of claim 24, wherein a portion of the resettable thermal fuse is disposed directly below the interface member, and another portion of the resettable thermal fuse is disposed laterally outside the interface member.

27. The method of claim 24, wherein the resettable thermal fuse comprises a positive temperature coefficient (PTC) fuse.

* * * * *